(12) United States Patent
Wu et al.

(10) Patent No.: US 9,177,824 B2
(45) Date of Patent: Nov. 3, 2015

(54) PHOTORESIST TREATMENT METHOD BY LOW BOMBARDMENT PLASMA

(71) Applicant: APPLIED MATERIALS, INC., Santa Clara, CA (US)

(72) Inventors: Banqiu Wu, San Jose, CA (US); Ajay Kumar, Cupertino, CA (US); Leonid Dorf, San Jose, CA (US); Shahid Rauf, Pleasanton, CA (US); Kartik Ramaswamy, San Jose, CA (US); Omkaram Nalamasu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/301,847

(22) Filed: Jun. 11, 2014

(65) Prior Publication Data

US 2014/0370708 A1 Dec. 18, 2014

Related U.S. Application Data

(60) Provisional application No. 61/834,391, filed on Jun. 12, 2013.

(51) Int. Cl.
| | |
|---|---|
| *H01L 21/311* | (2006.01) |
| *H01L 21/027* | (2006.01) |
| *G03F 7/004* | (2006.01) |
| *G03F 7/00* | (2006.01) |
| *H01J 37/32* | (2006.01) |

(52) U.S. Cl.
CPC ............ *H01L 21/31138* (2013.01); *G03F 7/00* (2013.01); *H01L 21/0273* (2013.01); *G03F 7/004* (2013.01); *G03F 7/0035* (2013.01); *H01J 37/3233* (2013.01); *H01J 37/3266* (2013.01); *H01J 37/32091* (2013.01)

(58) Field of Classification Search
CPC ......... G03F 7/004; G03F 7/0035; G03F 7/00; G03F 7/36
See application file for complete search history.

(56) References Cited

U.S. PATENT DOCUMENTS

| | | | | |
|---|---|---|---|---|
| 2006/0205223 | A1* | 9/2006 | Smayling | 438/725 |
| 2012/0322011 | A1* | 12/2012 | Wu et al. | 430/432 |
| 2014/0127907 | A1* | 5/2014 | Yang | 438/694 |

* cited by examiner

*Primary Examiner* — Duy Deo
(74) *Attorney, Agent, or Firm* — Moser Taboada; Alan Taboada

(57) ABSTRACT

Methods for reducing the line width roughness on a photoresist pattern are provided herein. In some embodiments, a method of processing a patterned photoresist layer disposed atop a substrate includes flowing a process gas into a processing volume of a process chamber having the substrate disposed therein; forming a plasma within the process chamber from the process gas, wherein the plasma has a ion energy of about 1 eV to about 10 eV; and etching the patterned photoresist layer with species from the plasma to at least one of smooth a line width roughness of a sidewall of the patterned photoresist layer or remove debris.

17 Claims, 3 Drawing Sheets

PHOTORESIST TREATMENT METHOD BY LOW BOMBARDMENT PLASMA

CROSS-REFERENCE TO RELATED APPLICATIONS

This application claims benefit of U.S. provisional patent application Ser. No. 61/834,391, filed Jun. 12, 2013, which is herein incorporated by reference in its entirety.

FIELD

Embodiments of the present disclosure generally relate to semiconductor substrate processing systems. More specifically, the present disclosure relates to reducing line width roughness in a photoresist pattern in semiconductor substrate processing systems.

BACKGROUND

As the dimensions of integrated circuit components decrease, more elements are put in a given area of a semiconductor integrated circuit. Accordingly, lithography processes have become more and more challenging to transfer even smaller features (e.g., less than 64 nm) onto a substrate precisely and accurately without damage. In order to transfer precise and accurate features onto a substrate, a desired high resolution lithography process requires having a suitable light source that may provide radiation at a desired wavelength range for exposure. Furthermore, the lithography process requires transferring features onto a photoresist layer with minimum photoresist line width roughness (LWR). A defect-free photomask is required to transfer desired features onto the photoresist layer.

Accordingly, the inventors have provided improved methods for reducing the line width roughness on a photoresist pattern.

SUMMARY

Methods for reducing the line width roughness on a photoresist pattern are provided herein. In some embodiments, a method of processing a patterned photoresist layer disposed atop a substrate includes flowing a process gas into a processing volume of a process chamber having the substrate disposed therein; forming a plasma within the process chamber from the process gas, wherein the plasma has a ion energy of about 1 eV to about 10 eV; and etching the patterned photoresist layer with species from the plasma to at least one of smooth a line width roughness of a sidewall of the patterned photoresist layer or remove debris.

In some embodiments, a method of processing a substrate includes depositing a photoresist material atop a substrate to form a photoresist layer; patterning the photoresist layer to form a patterned photoresist layer; flowing a process gas into a processing volume of a process chamber having the substrate disposed therein; forming a plasma within the process chamber from the process gas, wherein the plasma has a ion energy of about 1 eV to about 10 eV; and etching the patterned photoresist layer with species from the plasma to at least one of smooth a line width roughness of a sidewall of the patterned photoresist layer or remove debris.

In some embodiments, a method of processing a substrate comprising a target layer disposed atop the substrate and a patterned photoresist layer having a first pattern disposed atop the target layer is provided. In some embodiments, the method includes flowing a first process gas into a processing volume of a process chamber having the substrate disposed therein; forming a first plasma within the process chamber from the first process gas, wherein the first plasma has a ion energy of about 1 eV to about 10 eV; etching the patterned photoresist layer with species from the first plasma to at least one of smooth a line width roughness of a sidewall of the patterned photoresist layer or remove debris; flowing a second process gas into the processing volume of the process chamber; forming a second plasma within the process chamber from the second process gas; and etching the target layer with species from the second plasma to etch the first pattern into the target material.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
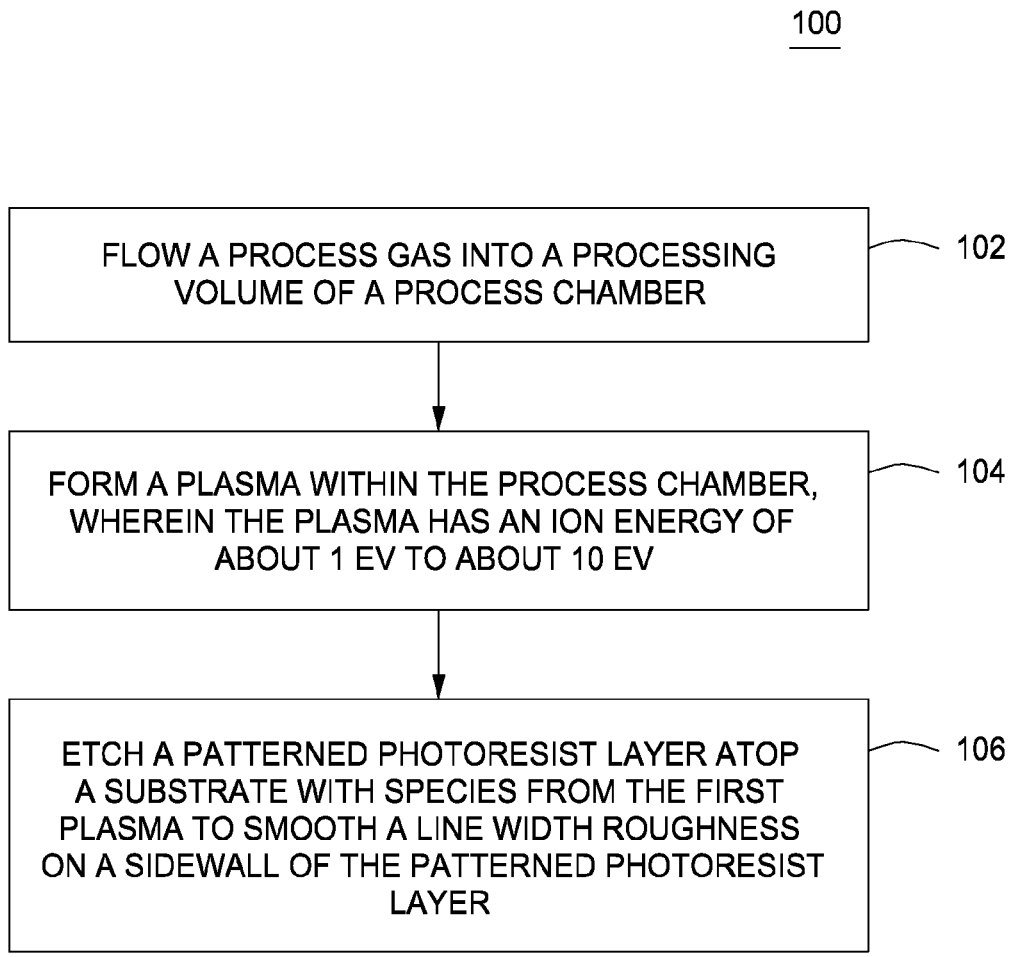
FIG. 1 depicts a flow chart of processing a patterned photoresist layer in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for processing patterned photoresist layers are provided herein. Embodiments of the present disclosure may advantageously allow for the reduction in the line width roughness on a photoresist pattern, as well as for the removal of debris from the pattern developed in the photoresist layer, resulting in an improvement in the uniformity of critical dimensions of an integrated circuit.

FIG. 1 depicts a flow chart of a method 100 of processing a patterned photoresist layer in accordance with some embodiments of the present disclosure. The method 100 is described herein with respect to the structure depicted in FIGS. 2A-2E.

Figure 2A:
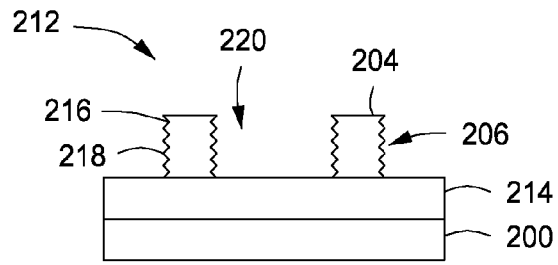
FIGS. 2A-2E depict stages of processing a patterned photoresist layer in accordance with some embodiments of the present disclosure.

FIG. 2A depicts a patterned photoresist layer 204 formed atop a substrate 200. The substrate 200 may comprise any suitable material used in the fabrication of semiconductor devices. For example, in some embodiments, the substrate 200 may comprise a semiconducting material and/or combinations of semiconducting materials and non-semiconductive materials for forming semiconductor structures and/or devices. For example, the substrate 200 may comprise one or more silicon-containing materials such as crystalline silicon (e.g., Si<100> or Si<111>), strained silicon, polysilicon, germanium, silicon germanium, or the like. The substrate 200 may further have any desired geometry, such as a 200 or 300 mm wafer, square or rectangular panels, or the like. In some embodiments, the substrate 200 may be a semiconductor wafer (e.g., a 200 mm, 300 mm, or the like silicon wafer). In some embodiments, the substrate 200 may include one or more layers (not shown) disposed atop, or formed within the substrate 200, for example, one or more of a dielectric layer, tunnel oxide layer, or the like.

In some embodiments, one or more target layers 214 may be disposed atop the substrate 200. For example, in some embodiments, a gate stack may be disposed atop the substrate 200. In some embodiments, the gate stack may have a plurality of layers comprising any materials suitable to fabricate a desired device. For example, in some embodiments, the plurality of layers may include one or more oxide layers, such as silicon oxide ($SiO_2$), one or more nitride layers, such as silicon nitride (SiN), combinations thereof, or the like. In some embodiments, the plurality of layers may comprise alternating oxide layers and nitride layers. In some embodiments, the pattern, for example of alternating oxide layers and nitride layers may repeat any number of times necessary to form a gate stack having a desired thickness. Each of the layers may have any thickness suitable to facilitate fabricating a desired device. In some embodiments, the layers may all have the same thickness, or in some embodiments, the layers may have varying thicknesses.

In some embodiments, the photoresist layer 204 may comprise any photoresist materials suitable to provide a template to facilitate etching the one or more target layers 214 having desired features. For example, in some embodiments, the photoresist layer 204 may be a positive or negative photoresist and/or a DUV or EUV (deep ultraviolet or extreme ultraviolet) photoresist and may comprise one or more of polymers, organic compounds (e.g., comprising carbon, hydrogen and oxygen), an amorphous carbon, such as Advanced Patterning Film (APF), available from Applied Materials, Inc., located in Santa Clara, Calif., a tri-layer resist (e.g., a photoresist layer, a Si-rich anti-reflective coating (ARC) layer, and a carbon-rich ARC, or bottom ARC (BARC) layer), a spin-on hardmask (SOH), or the like. The photoresist layer 204 may be formed to any thickness suitable to etch a desired number of features into the one or more target layers 214. For example, in some embodiments, the photoresist layer has a thickness of about 30 nm to about 300 nm.

The photoresist layer 204 may be formed by any suitable process, for example, a patterned etch process, spin coating process, optical lithography techniques, or the like. For example, in some embodiments, the portions of the photoresist layer 204 may be exposed to ultraviolet light and then removed to form a patterned photoresist layer 204. In some embodiments, the photoresist layer 204 may have a first pattern 212 to be etched into the target layers 214. In some embodiments, the first pattern 212 comprises openings 220 defined between the patterned photoresist layer 204 to expose the underlying target layers 214 for etching in order to transfer features onto the underlying target layers 214. However, inaccurate control or low resolution of the lithography exposure process may cause poor critical dimension control in the photoresist layer 204, thereby resulting in unacceptable line width roughness along the sidewalls 206 of the photoresist layer 204. A large amount of line width roughness may result in inaccurate feature transfer to the underlying target layers 214, eventually leading to device failure and yield loss. In some embodiments, the line width roughness along the sidewalls 206 of the patterned photoresist layer 204 is comprised of a series of dents 216 and bumps 218 along the sidewall of the patterned photoresist layer 204.

Figure 2B:
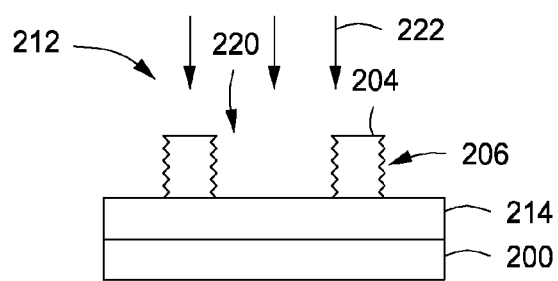

The method 100 of processing a patterned photoresist layer begins at 102, where a first process gas 222 is provided into the processing volume of a process chamber having the substrate 200, as depicted in FIG. 2B. The first process gas 222 may be any suitable process gas used to form an etching plasma. In some embodiments, where the materials selected for the photoresist layer 204 are organic materials, the first process gas 222 may be an oxygen containing gas, for example, oxygen gas ($O_2$), ozone ($O_3$), water vapor ($H_2O$), nitrous oxide ($N_2O$), nitrogen dioxide ($NO_2$), carbon monoxide (CO), carbon dioxide ($CO_2$), and the like. In some embodiments, other process gases may be supplied to the process chamber, individually or simultaneously, with the oxygen containing gas. For example, the process gas may include nitrogen gas ($N_2$), ammonia ($NH_3$), chlorine gas ($Cl_2$), or an inert gas such as argon (Ar). In some embodiments, the first process gas 222 is supplied to the process chamber at flow rate of about 30 sccm to about 300 sccm, for example about 100 sccm.

Figure 2C:
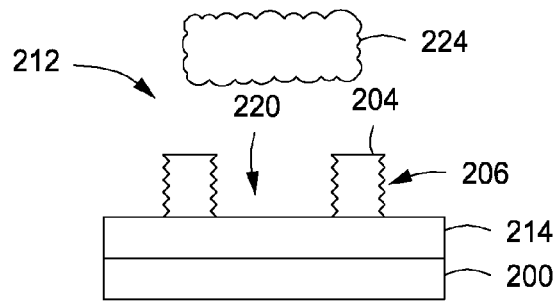

Next, at 104, a plasma 224 is formed within the process chamber from the first process gas 222, as depicted in FIG. 2C. The first process gas 222 can be ignited into a plasma using, for example, an electron beam discharged from an electron beam generator such as described below with respect to FIG. 3, or using an ion beam, or the like. In some embodiments, the plasma 224 formed within the process chamber has an ion energy of about 1 eV to about 10 eV. The inventors have observed that typical plasma-etch methods used to smooth the line edge roughness of a photoresist layer can result in damage to the photoresist layer and can also result in the rapid consumption of the photoresist layer by the etching plasma. The inventors have discovered that treating a photoresist layer with a plasma having an ion energy of about 1 eV to about 10 eV advantageously smoothes the line width roughness and removes debris from the pattern developed in the photoresist layer without damaging the photoresist layer and without significantly consuming the photoresist material.

Figure 2D:
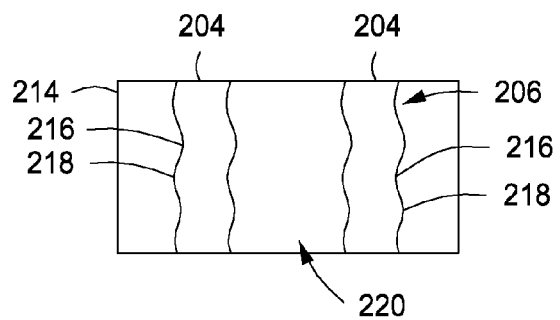

Next, at 106, the patterned photoresist layer 204 is etched with species from the plasma 224. FIG. 2D depicts a top view of the photoresist layer 204 having a series of dents 216 and bumps 218 along the sidewall of the patterned photoresist layer 204. The dents 216 and bumps 218 define, at least in part, the line width roughness. The plasma 224 smoothes the line width roughness on the sidewall 206 of the patterned photoresist layer 204. Advantageously, the etch at 106 predominantly, or substantially only, etches the patterned photoresist layer and not the underlying layers (e.g., the one or more target layers 214). Thus, the line width roughness may be reduced and debris removed without undesirably etching the underlying layer through the pattern in the photoresist.

In some embodiments, the etching process is performed for a preset period of time. In some embodiments, the etching process is performed for a period of about 20 seconds to about 240 seconds. In some embodiments, the etching process is performed until a desired degree of line width roughness is achieved (i.e. until the bumps 218 and dents 216 are smoothed out). Following completion of method 100, the sidewalls 206 of the patterned photoresist layer 204 have a substantially smooth edge surface defining an opening 220 in the patterned photoresist layer 204 that exposes the underlying target layer 214 for etching.

Figure 2E:
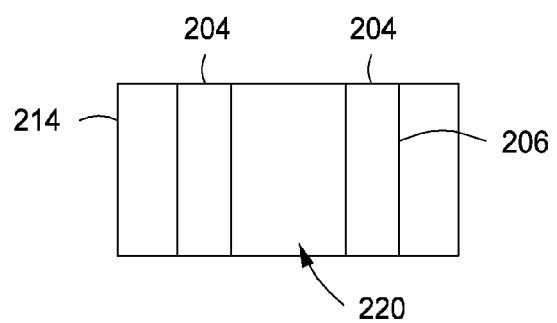

FIG. 2E depicts a top view of the line width roughness of the sidewalls 206 of the photoresist layer 204 that has a substantially smooth edge surface following application of method 100. In some embodiments, the line width roughness of the photoresist layer 204 is reduced between about 20 percent to about 40 percent. In some embodiments, a substantially smooth edge surface is achieved when the line width roughness is reduced to a range of about less than 4 nm. In some embodiments, the line width roughness may be reduced to a range of about 2 nm to about 3 nm. In some embodiments, the line width roughness may be reduced to a range of about less than 2 nm. The method 100 advantageously reduces the line width roughness as described above without significantly consuming the photoresist material. For example, in some embodiments, the method consumes only about 0.5 to about 2 nm in thickness of the patterned photoresist layer.

In some embodiments, an RF bias power is applied to the substrate 200 during the etching process from an RF power source. Applying a bias power during the etching process advantageously enhances the transport of plasma species created by the etching plasma to the surface of the substrate 200. In some embodiments, the bias power is about 5 watts to about 50 watts.

In some embodiments, after method 100 has reduced the line width roughness and removed debris from the pattern developed in the photoresist layer, the first pattern 212 may be etching into the underlying target layers 214 atop the substrate. In some embodiments, the first pattern 212 is etching into the target layers 214 by forming a second plasma within the process chamber using a second process gas. In some embodiments, the second process gas can be any process gas suitable for etching the target layers 214 for example, an oxygen containing gas, such as oxygen gas ($O_2$), ozone ($O_3$), water vapor ($H_2O$), nitrous oxide ($N_2O$), nitrogen dioxide ($NO_2$), carbon monoxide (CO), carbon dioxide ($CO_2$), and the like. In some embodiments, other process gases may be supplied to the process chamber, individually or simultaneously, with the oxygen-containing gas. For example, the process gas may include nitrogen gas ($N_2$), ammonia ($NH_3$), chlorine gas ($Cl_2$), or an inert gas such as argon (Ar).

Figure 3:
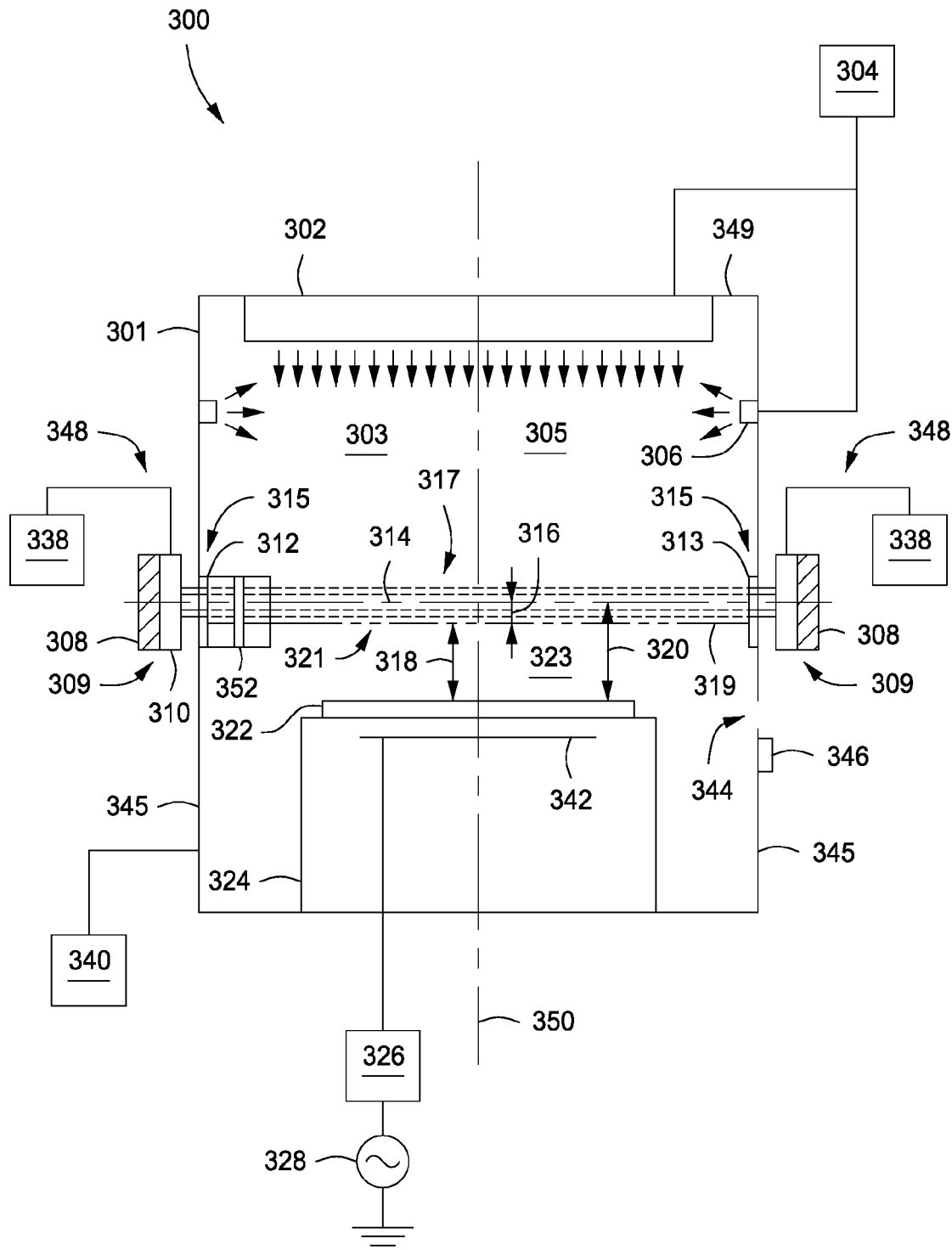
FIG. 3 depicts a process chamber suitable for performing portions of the present disclosure in accordance with some embodiments of the present disclosure.

In some embodiments, the method 100 may be performed using a suitable plasma etching process in a suitable process chamber. In some embodiments, the etch chamber may be a standalone process chamber as described in FIG. 3. FIG. 3 depicts a schematic diagram of an illustrative process chamber 300 of the kind that may be used to practice embodiments of the disclosure as discussed herein. The process chamber 300 may be utilized alone or as a processing module of an integrated semiconductor substrate processing system, or cluster tool, such as a CENTURA® integrated semiconductor substrate processing system, available from Applied Materials, Inc. of Santa Clara, Calif. Exemplary process chambers may include the DPS®, ENABLER®, ADVANTEDGE™, or other process chambers, available from Applied Materials, Inc. of Santa Clara, Calif. Other suitable process chambers may similarly be used. Other etch reactors and/or cluster tools may suitably be used as well.

The process chamber 300 generally comprises a chamber body 301 defining an inner volume 303 that may include a processing volume 305. The processing volume 305 may be defined, for example, between a substrate support pedestal 324 disposed within the process chamber 300 for supporting a substrate 322 thereupon during processing and one or more gas inlets, such as a showerhead 302 and/or nozzles 306 provided at desired locations. In some embodiments, the substrate support pedestal 324 may include a mechanism that retains or supports the substrate 322 on the surface of the substrate support pedestal 324, such as an electrostatic chuck, a vacuum chuck, a substrate retaining clamp, or the like (not shown). In some embodiments, the substrate support pedestal 324 may include mechanisms for controlling the substrate temperature (such as heating and/or cooling devices, not shown) and/or for controlling the species flux and/or ion energy proximate the substrate surface.

For example, in some embodiments, the substrate support pedestal 324 may include an electrode 342. The electrode 342 may be coupled to one or more bias power sources (one bias power source 328 shown) through one or more respective matching networks (matching network 326 shown). The one or more bias power sources may provide RF or DC energy in a pulsed or continuous mode. For example, in some embodiments, the one or more bias power sources may be one or more RF power sources. In some embodiments, two or more bias power sources may be provided for coupling RF power through respective matching networks to the electrode 342 (e.g., an RF bias electrode) at respective frequencies of, for example, any of the frequencies discussed above. One or more of the bias power sources may provide either continuous or pulsed power. In some embodiments, the one or more bias power sources 328 may be a DC or pulsed DC source.

The substrate 322 may enter the process chamber 300 via an opening 344 in a wall 345 of the chamber body 301. The opening 344 may be selectively sealed via a slit valve 346, or other mechanism for selectively providing access to the interior of the chamber through the opening 344. The substrate support pedestal 324 may be coupled to a lift mechanism (not shown) that may control the position of the substrate support pedestal 324 between a lower position suitable for transferring substrates into and out of the chamber via the opening 344 and a selectable upper position suitable for processing. The process position may be selected to maximize process uniformity for a particular process. When in at least one of the elevated processing positions, the substrate support pedestal 324 may be disposed above the opening 344 to provide a symmetrical processing region.

The showerhead 302 and/or nozzles 306 may be coupled to a gas supply 304 for providing one or more process gases into the processing volume 305 of the process chamber 300. Although only two nozzles 306 are shown in FIG. 3 disposed on the walls 345 of the chamber body 301, additional or alternative gas nozzles or inlets may be disposed in the ceiling 349 or on the walls 345 of the chamber body 301 or at other locations suitable for providing gases as desired to the process chamber 300, such as the base of the process chamber 300, the periphery of the substrate support pedestal 324, or the like. An exhaust system 340 comprising a vacuum pump (not shown) may be coupled to the process chamber 300 for pumping out the exhaust gases from the inner volume 303.

In some embodiments, the process chamber 300 may utilize an electron beam generator 315 to generate an electron beam 321 to ignite a process gas (e.g. a process gas provided by gas supply 304) to form a plasma in the processing volume 305. For example, in such embodiments the process chamber 300 may comprise a cathode 312 and an accelerating electrode 352 disposed within an electron beam generator coupled to a wall 345 of the chamber body 301 and configured to produce electrons having an adequate amount of energy to ignite the process gas. An anode 313 may be disposed on a wall 345 opposite the cathode 312 and configured to attract the electrons produced by the cathode 312.

The electron beam generator 315 may be disposed at any position within the process chamber 300 to provide the electron beam 321 at a suitable distance from the substrate 322 to perform the desired process. For example, in some embodiments, the electron beam generator 315 may be positioned to form an electron beam in a direction substantially parallel to an upper surface of the substrate such that a distance 318 between a central axis 319 of the electron beam 321 and an upper surface of the substrate 322 may be about 2 mm to about 30 mm. In some embodiments, the distance 318 may be selected to adjust the plasma density in an area 323 proximate the substrate. For example, as the distance 318 between the central axis 319 of the electron beam 321 and the substrate 322 decreases the density of the plasma in the area 323 proximate the substrate 322 may increase. Alternatively, as the distance 318 between the central axis 319 of the electron beam 321 and the substrate 322 increases, the density of the plasma in the area 323 proximate the substrate 322 may decrease.

In some embodiments, a magnetic field forming device 348 is disposed proximate the walls 345 of the chamber body 301 and configured to form a magnetic field 317 having magnetic field lines that are substantially planar and substantially parallel to facilitate control over the plasma formed in the processing volume 305. The magnetic field forming device 348 generally comprises a plurality of coils 310 positioned symmetrically about a central axis 350 of the process chamber 300. The magnetic field forming device 348 may comprise any amount of coils 310 suitable for forming a magnetic field (i.e., magnetic field 317) having the desired shape and orientation.

One or more power supplies 338 may be coupled to the plurality of coils 310 to selectively provide an electric current through one or more of the plurality of coils 310 to produce the desired magnetic field 317 within the process chamber 300. In operation, the magnetic field 317 confines at least some of the electrons (negatively charged particles) of the electron beam 321 and/or the plasma, thereby facilitating control over the plasma.

In some embodiments, a shield 308 may be disposed around the plurality of coils 310 to shield other equipment (e.g., controllers, process chambers, other fabrication equipment, or the like) from the magnetic field 317. The shield 308 may comprise any material suitable to impede the magnetic field 317, such as a metal, for example stainless steel. In addition, the shield 308 may have any suitable geometry (e.g., size and shape) that provides the desired shielding effect. For example, in some embodiments, the shield 308 may be sized to cover an outer facing surface 309 of the plurality of coils 310. The shield 308 may be continuous and extend from coil to coil, or alternatively, the shield 308 may comprise a plurality of discrete elements disposed proximate each individual coil (or groups of coils). The shield 308 may be in direct contact with the coils or may be spaced apart from the coils.

The magnetic field forming device 348 may be disposed at any position about the process chamber 300 to provide the magnetic field 317, and therefore control the plasma, in a suitable location with respect to the substrate 322. For example, in some embodiments, the magnetic field forming device 348 may be positioned such that a distance 320 between a central axis 314 of the magnetic field 317 and the substrate 322 may be about 2 mm to about 50 mm. In some embodiments, the distance 320 may be selected to adjust the plasma density in an area 323 proximate the substrate. For example, as the distance 320 between the central axis 314 of the magnetic field 317 and the substrate 322 decreases the density of the plasma in the area 323 proximate the substrate 322 may increase. Alternatively, as the distance 320 between the central axis 314 of the magnetic field 317 and the substrate 322 increases, the density of the plasma in the area 323 proximate the substrate 322 may decrease.

In addition, the position of the magnetic field forming device 348 and the electron beam generator 315 may be selected to adjust a distance 316 between the central axis 314 of the magnetic field 317 and the central axis 319 of the electron beam 321. In some embodiments, by varying the distance 316 between the central axis 314 of the magnetic field 317 and the central axis 319 of the electron beam 321, the amount of electrons of the electron beam 321 confined to a given plane may be adjusted. In some embodiments, as the distance 316 between the central axis 314 of the magnetic field 317 and the central axis 319 of the electron beam 321 is decreased more of the electrons of the electron beam 321 are confined to a given plane, thus increasing the confinement (and reducing or eliminating divergence) of the electron beam 321, thereby preventing electrons from the electron beam 321 from impinging on the substrate 322. For example, in some embodiments the distance 316 between the central axis 314 of the magnetic field 317 and the central axis 319 of the electron beam 321 may be up to about a thickness of the electron beam 321.

While the foregoing is directed to embodiments of the present disclosure, other and further embodiments of the disclosure may be devised without departing from the basic scope thereof.

The invention claimed is:

1. A method of processing a patterned photoresist layer disposed atop a substrate, comprising:
    flowing a process gas used to form an etching plasma into a processing volume of a process chamber having the substrate disposed therein;
    forming a plasma within the process chamber from the process gas, wherein the plasma has a ion energy of about 1 eV to about 10 eV;
    etching the patterned photoresist layer with species from the plasma to at least one of smooth a line width roughness of a sidewall of the patterned photoresist layer or remove debris; and
    wherein forming the plasma further comprises igniting the process gas by discharging an electron beam from an electron beam generator in a direction substantially parallel to an upper surface of the substrate and a distance between a central axis of the electron beam and an upper surface of the substrate is about 2 mm to about 30 mm.

2. The method of claim 1, further comprising applying an RF bias to the substrate after forming the plasma.

3. The method of claim 2, wherein the RF bias is applied using an RF power source providing about 5 to about 50 watts of power.

4. The method of claim 1, further comprising etching the patterned photoresist layer until the line width roughness is less than about 4 nm.

5. The method of claim 1, further comprising etching the patterned photoresist layer until the line width roughness is less than about 2 nm.

6. The method of claim 1, wherein etching the patterned photoresist layer consumes about 0.5 nm to about 2 nm of the patterned photoresist layer.

7. The method of claim 1, further comprising:
    depositing a photoresist material atop a substrate to form a photoresist layer; and
    patterning the photoresist layer to form a patterned photoresist layer.

8. The method of claim 1, wherein the process gas comprises one or more of oxygen gas ($O_2$), ozone ($O_3$), water vapor ($H_2O$), nitrous oxide ($N_2O$), nitrogen dioxide ($NO_2$), carbon monoxide (CO), carbon dioxide ($CO_2$), nitrogen gas ($N_2$), ammonia ($NH_3$), chlorine gas ($Cl_2$), or an inert gas.

9. A method of processing a substrate comprising a target layer disposed atop the substrate and a patterned photoresist layer having a first pattern disposed atop the target layer, the method comprising:

flowing a first process gas used to form an etching plasma into a processing volume of a process chamber having the substrate disposed therein;

forming a first plasma within the process chamber from the first process gas, wherein the first plasma has a ion energy of about 1 eV to about 10 eV;

etching the patterned photoresist layer with species from the first plasma to at least one of smooth a line width roughness of a sidewall of the patterned photoresist layer or remove debris;

flowing a second process gas into the processing volume of the process chamber;

forming a second plasma within the process chamber from the second process gas;

etching the target layer with species from the second plasma to etch the first pattern into the target layer; and wherein forming the first plasma further comprises igniting the first process gas by discharging an electron beam from an electron beam generator in a direction substantially parallel to an upper surface of the substrate and a distance between a central axis of the electron beam and an upper surface of the substrate is about 2 mm to about 30 mm.

10. The method of claim 9, further comprising applying an RF bias to the substrate after forming the first plasma, wherein the RF bias is applied using an RF power source providing about 5 to about 50 watts of power.

11. The method of claim 9, further comprising etching the patterned photoresist layer until the line width roughness is less than about 4 nm.

12. The method of claim 9, wherein etching the patterned photoresist layer consumes about 0.5 nm to about 2 nm of the patterned photoresist layer.

13. The method of claim 9, wherein the process gas comprises one or more of oxygen gas ($O_2$), ozone ($O_3$), water vapor ($H_2O$), nitrous oxide ($N_2O$), nitrogen dioxide ($NO_2$), carbon monoxide (CO), carbon dioxide ($CO_2$), nitrogen gas ($N_2$), ammonia ($NH_3$), chlorine gas ($Cl_2$), or an inert gas.

14. A method of processing a patterned photoresist layer disposed atop a substrate, comprising:

depositing a photoresist material atop a substrate to form a photoresist layer;

patterning the photoresist layer to form a patterned photoresist layer;

flowing a process gas into a processing volume of a process chamber having the substrate disposed therein;

igniting the process gas by discharging an electron beam from an electron beam generator in a direction substantially parallel to an upper surface of the substrate to form a plasma within the process chamber from the process gas, wherein the plasma has a ion energy of about 1 eV to about 10 eV and wherein a distance between a central axis of the electron beam and an upper surface of the substrate is about 2 mm to about 30 mm; and etching the patterned photoresist layer with species from the plasma to at least one of smooth a line width roughness of a sidewall of the patterned photoresist layer or remove debris.

15. The method of claim 14, further comprising applying an RF bias to the substrate after forming the plasma.

16. The method of claim 14, further comprising etching the patterned photoresist layer until the line width roughness is less than about 4 nm.

17. The method of claim 14, wherein the process gas comprises one or more of oxygen gas ($O_2$), ozone ($O_3$), water vapor ($H_2O$), nitrous oxide ($N_2O$), nitrogen dioxide ($NO_2$), carbon monoxide (CO), carbon dioxide ($CO_2$), nitrogen gas ($N_2$), ammonia ($NH_3$), chlorine gas ($Cl_2$), or an inert gas.

\* \* \* \* \*